(12) United States Patent
Lin et al.

(10) Patent No.: US 11,989,373 B2
(45) Date of Patent: May 21, 2024

(54) SIGNAL COMPENSATION CIRCUIT FOR COMPENSATING UNWANTED ELECTRICAL ACTIVITY ON TOUCH SENSORS, TOUCH CONTROL CIRCUIT, AND DISPLAY DEVICE

(71) Applicant: JADARD TECHNOLOGY INC., Shenzhen (CN)

(72) Inventors: Feng-Wei Lin, Tainan (TW); Yu-Chieh Hsu, Tainan (TW); Long Chen, Shenzhen (CN)

(73) Assignee: JADARD TECHNOLOGY INC., Shenzhen (CN)

( * ) Notice: Subject to any disclaimer, the term of this patent is extended or adjusted under 35 U.S.C. 154(b) by 274 days.

(21) Appl. No.: 17/472,909

(22) Filed: Sep. 13, 2021

(65) Prior Publication Data
US 2022/0334703 A1 Oct. 20, 2022

(30) Foreign Application Priority Data
Apr. 19, 2021 (CN) .......................... 202110421108.8

(51) Int. Cl.
*G06F 3/041* (2006.01)
*H03K 17/687* (2006.01)

(52) U.S. Cl.
CPC ..... *G06F 3/04186* (2019.05); *H03K 17/6871* (2013.01)

(58) Field of Classification Search
CPC ............... G06F 3/04186; G06F 3/0418; G06F 3/04164; G06F 3/0446; H03K 17/6871
See application file for complete search history.

(56) References Cited

U.S. PATENT DOCUMENTS

| | | | | |
|---|---|---|---|---|
| 2016/0349872 A1* | 12/2016 | Hargreaves | ........... | G06F 3/0443 |
| 2016/0378232 A1* | 12/2016 | Hsu | ..................... | G06F 3/04184 |
| | | | | 345/174 |
| 2020/0150230 A1* | 5/2020 | Kriebernegg | ........ | H03K 17/941 |

FOREIGN PATENT DOCUMENTS

CN  110196653 A  9/2019

* cited by examiner

*Primary Examiner* — Rodney Amadiz
(74) *Attorney, Agent, or Firm* — ScienBiziP, P.C.

(57) ABSTRACT

A circuit to cancel the effect of parasitic capacitances ("initial signals") in calculations as to precise touch locations on a touch display screen (signal compensation circuit) includes first and second compensation circuits connected to a charge-discharge node. The first compensation circuit receives initial signals, generates first charging currents to charge, and first discharging currents to discharge, the charging-discharging node. The second compensation circuit generates second charging currents to charge, and second discharging currents to discharge, the charging-discharging node. Values of the first charging currents, the second charging currents, the first discharging currents, and the second discharging currents are of different magnitudes and are applied in order to amount to a more precise match for the exact compensation value required. The charging-discharging node outputs target signals according to the initial signals as compensated by the compensation values to achieve uniformity of initial signals across the entire touch display screen.

10 Claims, 7 Drawing Sheets

FIG. 6

SIGNAL COMPENSATION CIRCUIT FOR COMPENSATING UNWANTED ELECTRICAL ACTIVITY ON TOUCH SENSORS, TOUCH CONTROL CIRCUIT, AND DISPLAY DEVICE

FIELD

The subject matter herein generally relates to signal compensation technique, and particularly relates to a signal compensation circuit, a touch control circuit including the signal compensation circuit, and a display device including the touch control circuit.

BACKGROUND

A conventional touch panel includes a plurality of touch sensors. When the touch panel is touched by an object (such as a fingertip), sensing signals are generated by at least one of the touch sensors, wherein the sensing signals are used to calculate the touch position.

When the touch panel is applied in an electrical device (such as a display device), parasitic capacitances are formed between the touch sensors and conductive structures (such as scanning lines and data lines) in the electrical device. Therefore, electrical activity can be registered on the touch sensors even before the touch panel is touched. The values of such electrical activity can be taken for touch signals because of the conductive structures. The touch position calculated according to such electrical activity may be inaccurate since the values of the electrical activity are different from actual touch signals.

A compensation circuit is used in the art to compensate for unwanted electrical activity on the touch sensors, to improve a uniformity of the values. However, the compensation circuit in the prior art increases a resolution by adding circuit units, which increases a size of the compensation circuit and takes up space.

BRIEF DESCRIPTION OF THE DRAWINGS

Implementations of the present disclosure will now be described, by way of embodiment, with reference to the attached figures.

FIG. 6 is a schematic diagram illustrating initial signals on a plurality of touch electrodes.

DETAILED DESCRIPTION

Figure 1:
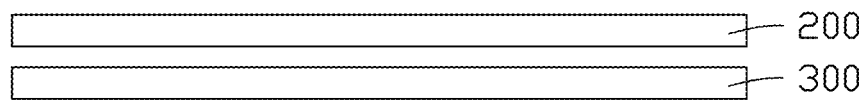
FIG. 1 is a schematic diagram of a display device in an embodiment of the present disclosure.

It will be appreciated that for simplicity and clarity of illustration, where appropriate, reference numerals have been repeated among different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

A display device 100 in the present embodiment of the present disclosure is shown in FIG. 1. The display device 100 includes a touch panel 200 and a display panel 300 stacked on the touch panel 200. The touch panel 200 is used to receive touches of an object (such as a fingertip or a touch pen), generate sensing signals, and calculate a touch position of the object according to the sensing signals. The display panel 300 is used to emit light to display images. In other embodiments, the display panel 300 may not be stacked on the touch panel. For example, the touch panel 200 may be embedded in the display panel 300.

Figure 2:
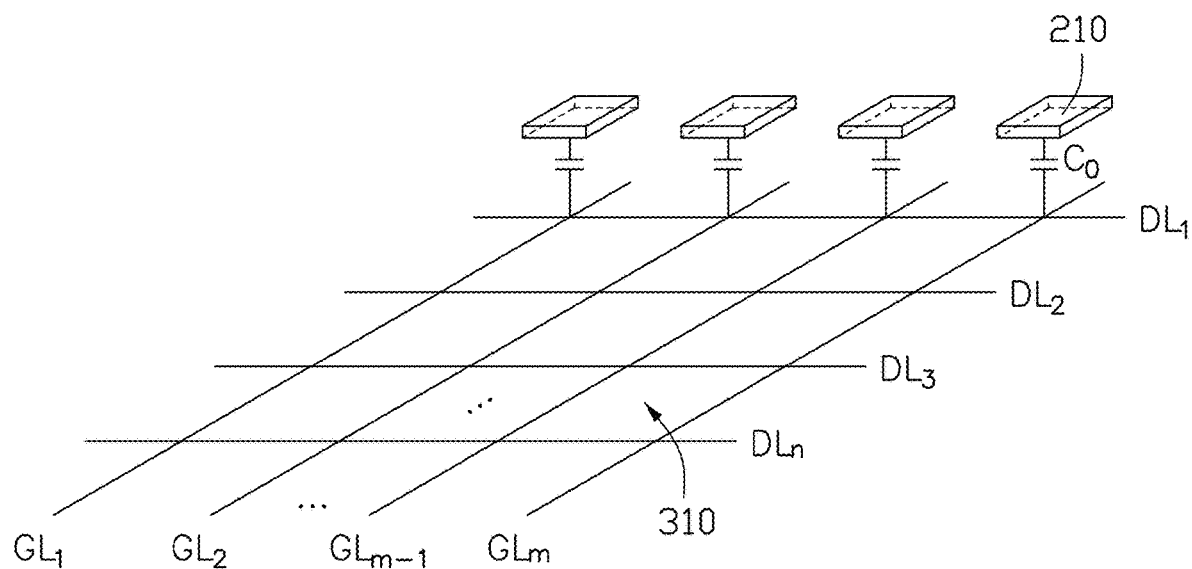
FIG. 2 is a schematic diagram illustrating parasitic capacitances formed in the display device in FIG. 1.

Referring to FIG. 2, the display panel 300 includes a plurality of scanning lines $GL_1$-$GL_m$ and a plurality of data lines $DL_1$-$DL_n$. The scanning lines $GL_1$-$GL_m$ are in parallel with each other, and the data lines $DL_1$-$DL_n$ are in parallel with each other. The scanning lines $GL_1$-$GL_m$ are electrically insulated from the data lines $DL_1$-$DL_n$; the scanning lines $GL_1$-$GL_m$ intersect with the data lines $DL_1$-$DL_n$ to define a plurality of pixels 310. The scanning lines $GL_1$-$GL_m$ are configured to receive a scanning signal in turn, so that the pixels 310 can receive image data in turn. Each pixel 310 is configured to receive the image data from one of the data lines $DL_1$-$DL_n$ to make the display panel 300 display images.

The touch panel 200 includes a plurality of touch electrodes 210 in a same layer. Each touch electrode 210 has a facing area with the scanning lines $GL_1$-$GL_m$ and the data lines $DL_1$-$DL_n$. That is, a projection of each touch electrode 210 on the display panel 300 has an overlapping area with the scanning lines $GL_1$-$GL_m$ and the data lines $DL_1$-$DL_n$. Therefore, a parasitic capacitance $C_0$ is formed between each touch electrode 210 and the scanning lines $GL_1$-$GL_m$ and the data lines $DL_1$-$DL_n$.

Due to the parasitic capacitance $C_0$, there is an initial signal on each touch electrode 210 even though no object is touching the touch panel 200. Generally, due to differences of the scanning lines $GL_1$-$GL_m$ and the data lines $DL_1$-$DL_n$, values of the parasitic capacitances $C_0$ formed between the touch electrode 210 and the scanning lines $GL_1$-$GL_m$ and the data lines $DL_1$-$DL_n$ are different. That is, when no object is touching the touch panel 200, the initial signals on the touch electrodes 210 are different. When the touch panel 200 is actually touched by an object, the touch electrodes 210 at the touch position generate sensing signals. Since the touch electrodes 210 have different initial signals, the touch position calculated according to the sensing signals is inaccurate.

Figure 3:
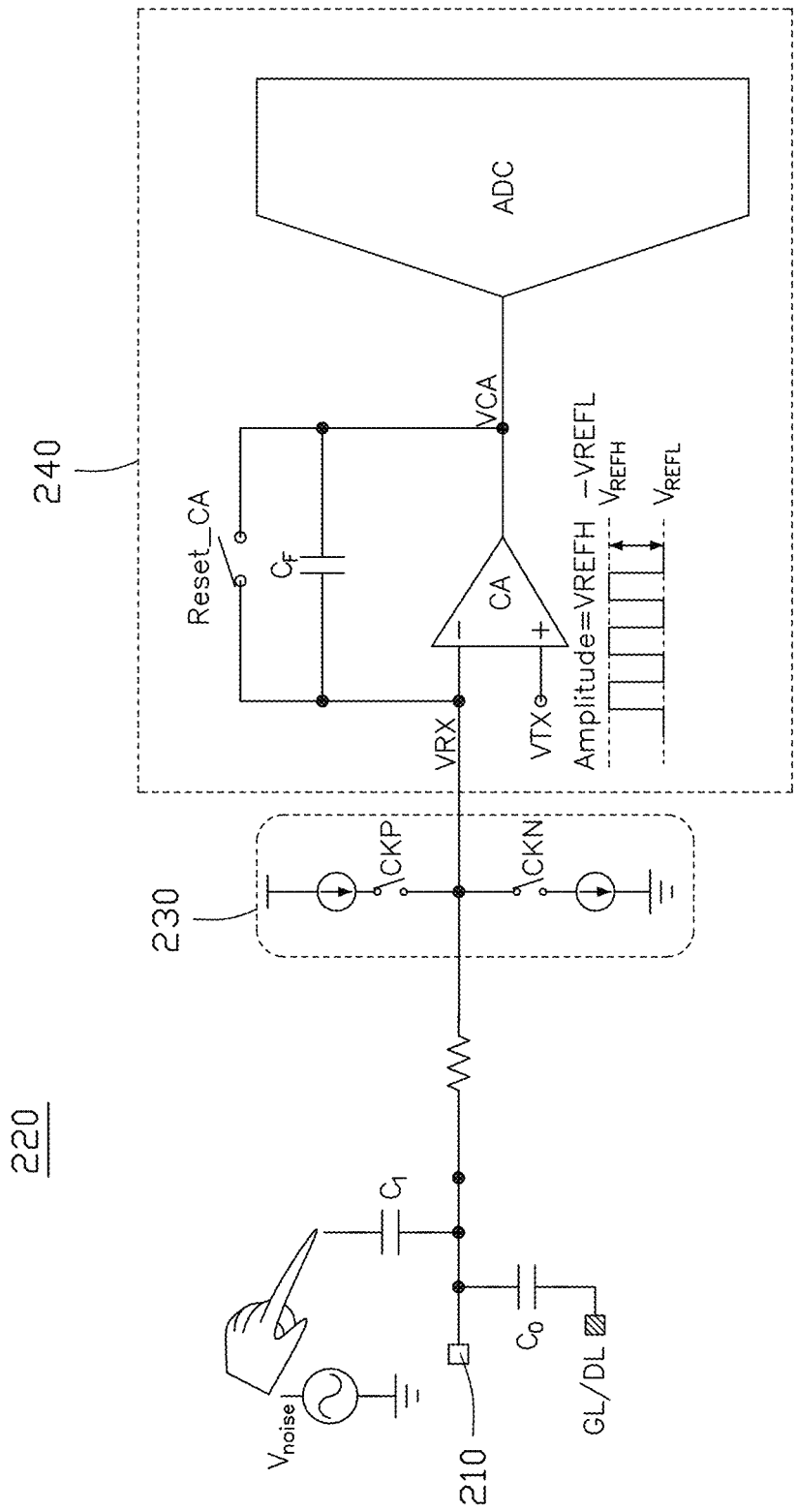
FIG. 3 is a schematic diagram of a touch control circuit in the display device in FIG. 1.

The touch panel 200 further includes a touch control circuit 220 as shown in FIG. 3. The touch control circuit 220 includes the touch electrodes 210 (only one of the touch electrodes 210 is shown in FIG. 3), a signal processing circuit 240, and a signal compensation circuit 230. The signal compensation circuit 230 electrically connected to each touch electrode 210 and the signal processing circuit 240. The signal compensation circuit 230 in the present embodiment is configured to apply compensation to the initial signals on the touch electrodes 210 to adjust values of the sensing signals C1 from the touch electrodes 210. The adjusted sensing signals are outputted as actual touch signals (hereinafter "target signals"). A charging-discharging node VRX is between the signal compensation circuit 230 and the signal processing circuit 240, wherein the target signals are outputted from the charging-discharging node VRX for the signal processing circuit 240 to calculate the touch position. By applying compensation to the initial signals, the different the initial signals on the touch electrodes 210 can be reduced and accuracy of the touch position more precisely calculated.

Figure 4:
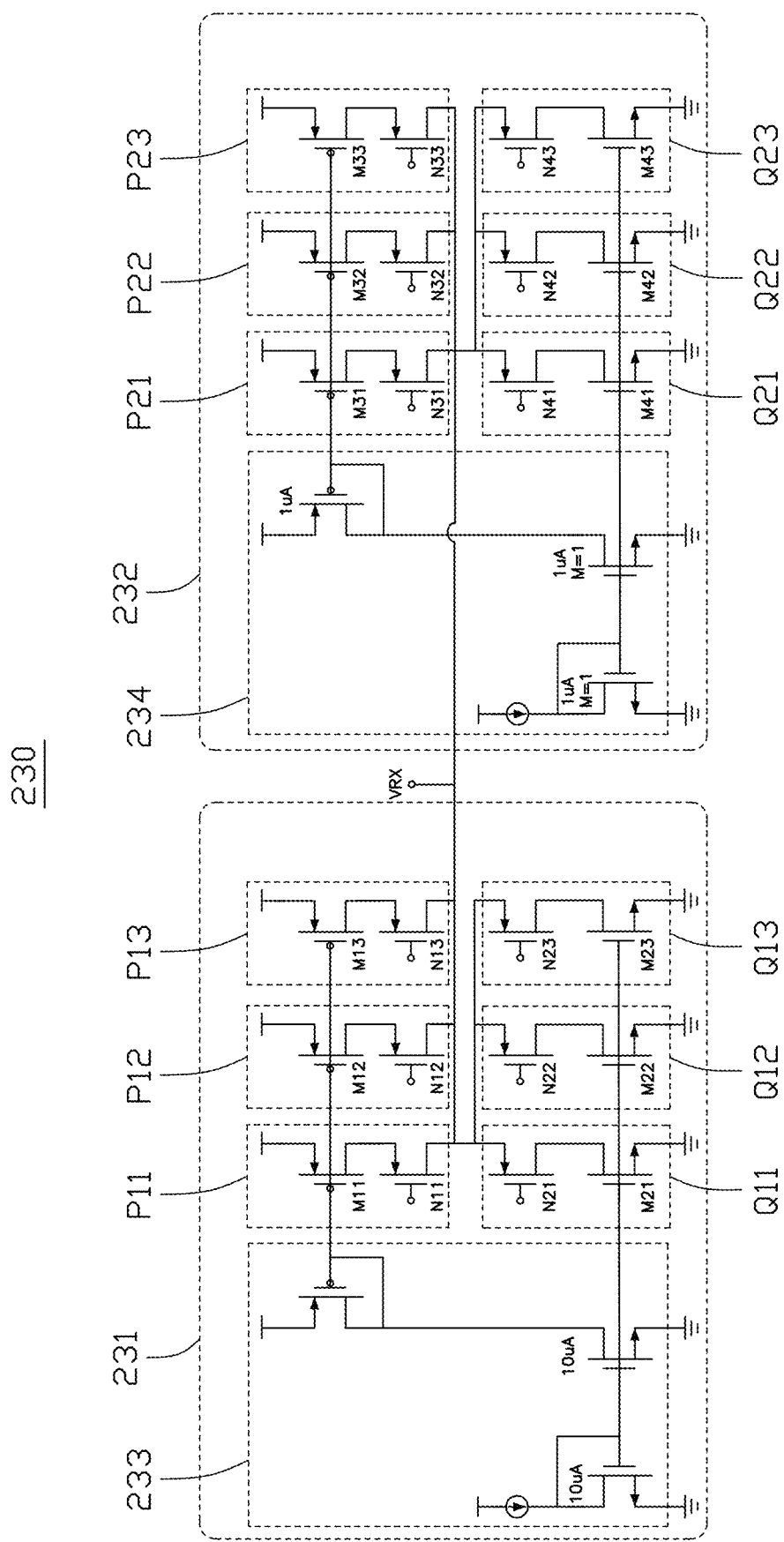
FIG. 4 is a schematic diagram of a signal compensation circuit in the control circuit in FIG. 3

Referring to FIG. 4, the signal compensation circuit 230 includes a first compensation circuit 231 and a second compensation circuit 232 electrically connected to the charging-discharging node VRX. The first compensation circuit 231 is electrically connected to the touch electrodes 210 for receiving the sensing signals from the touch electrodes 210.

Both the first compensation circuit 231 and the second compensation circuit 232 work in at least one charging period and at least one discharging period. During the charging period, the first compensation circuit 231 is configured to generate a plurality of first charging currents to charge the charging-discharging node VRX, and the second compensation circuit 232 is configured to generate a plurality of second charging currents to charge the charging-discharging node VRX. During the discharging period, the first compensation circuit 231 is configured to generate a plurality of first discharging currents to discharge the charging-discharging node VRX, and the second compensation circuit 232 is configured to generate a plurality of second discharging currents to discharge the charging-discharging node VRX.

A sum of the first charging currents and the second charging currents is defined as a total charging current, and a sum of the first discharging currents and the second discharging currents is defined as a total discharging current. A difference between the total charging current and the total discharging current is defined as a plurality of compensation values for compensating the initial signals on the touch electrodes 210. The compensation values are adjusted by adjusting values of the first charging currents, the second charging currents, the first discharging currents, and the second discharging currents. The signal compensation circuit 230 is configured to apply compensation to the initial signals based on the compensation values. The charging-discharging node VRX is configured to output the target signals compensated based on the compensation values. The target signals are configured for the signal processing circuit 240 to be able to calculate the touch position.

The greater the value of the first charging currents and the second charging currents generated by the first compensation circuit 231 and the second compensation circuit 232, the greater will be the amplitude of a single adjustment of the initial signals. The greater the single adjustment of the initial signals, the fewer will be the number of times required to adjust to a certain signal value. However, an adjustment accuracy is reduced (that is, the resolution is reduced) when the single adjustment amplitude is increased. For example, if an initial signal needs to be adjusted from a value of 100 to a value of 55 with a single adjustment amplitude of 10, the value of 100 can be adjusted to a value close to the required value of 55 (such as a value of either 50 or 60) after several adjustments, but total accuracy in an adjustment to the value of 55 is not possible.

In the present embodiment, the number of adjustments and the adjustment accuracy are balanced by setting in a certain way the values of the first charging currents and the second charging currents generated by the first compensation circuit 231 and the second compensation circuit 232. In the present embodiment, the values of the first charging currents generated by the first compensation circuit 231 are greater than the values of the second charging currents generated by the second compensation circuit 232, and the values of the first discharging currents generated by the first compensation circuit 231 are greater than the values of the second discharging currents generated by the second compensation circuit 232. That is, amplitude of a single adjustment of the first compensation circuit 231 is larger than an amplitude of a single adjustment of the second compensation circuit 232. Therefore, the sensing signals are effectively "coarse-tuned" by the first compensation circuit 231 and then "fine-tuned" by the second compensation circuit 232. The first compensation circuit 231 and the second compensation circuit 232 cooperate to apply compensation as an adjustment of the sensing signals to improve the adjustment accuracy.

The first compensation circuit 231 includes a plurality of first charging loops connected in parallel and electrically connected to the charging-discharging node VRX. The first charging loops are independently controlled to be on or off. The first charging loops may be on during the charging period to generate the first charging currents, and the values of the first charging currents generated by the first charging loops may be different.

Taking the signal compensation circuit 230 shown in FIG. 4 as an example, the first compensation circuit 231 includes three first charging loops (first charging loops P11, P12, and P13) connected in parallel. The first charging current of 40 microamperes (μA) is generated when the first charging loop P11 is on, the first charging current of 20 microamperes (μA) is generated when the first charging loop P12 is on, and the first charging current of 10 microamperes (μA) is generated when the first charging loop P13 is on.

Each first charging loop includes a first charging switch and a first charging element electrically connected. The first charging switch is used to control the first charging loop on or off, and the first charging element is used to generate the first charging current when the first charging loop is on.

Taking the signal compensation circuit 230 shown in FIG. 4 as an example, in the present embodiment, the first charging loop P11 includes a first charging element M11 and a first charging switch N11. The first charging element M11 and the first charging switch N11 are metal oxide semiconductor field effect transistors (MOS-FET). In other embodiments, the first charging element M11 and the first charging switch N11 may be other three terminal elements, such as triodes.

Both the first charging element M11 and the first charging switch N11 include a source electrode, a drain electrode, and a gate electrode. The source electrode of the first charging element M11 is electrically connected to a system power, the drain electrode of the first charging element M11 is electrically connected to the source electrode of the first charging switch N11, the drain electrode of the first charging switch N11 is electrically connected to the charging-discharging node VRX, and the gate electrode of the first charging switch N11 is electrically connected to a control module (not shown in the figures).

The control module is configured to output a control signal to the gate electrode of the first charging switch N11 to switch the first charging switch N11 on or off. The first charging loop P11 is on if the first charging switch N11 is on, wherein the first charging current is generated by the first charging element M11 to charge the charging-discharging node VRX. The first charging loop P11 is off if the first charging switch N11 is off, wherein the first charging current is not generated and the charging-discharging node VRX is not charged.

The first charging loop P12 includes a first charging element M12 and a first charging switch N12, and the first charging loop P13 includes a first charging element M13 and a first charging switch N13. Structures and working principles of the first charging loops P11, P12, and P13 are the same.

The first compensation circuit 231 includes a plurality of first discharging loops connected in parallel and electrically connected to the charging-discharging node VRX. The first discharging loops are independently controlled to be on or off. The first discharging loops may be on during the discharging period to generate the first discharging currents, and the values of the first discharging currents generated by the first discharging loops may be different.

Taking the signal compensation circuit 230 shown in FIG. 4 as an example, the first compensation circuit 231 further includes three first discharging loops (first discharging loops Q11, Q12, and Q13) connected in parallel. The first discharging current of 40 microamperes ($\mu A$) is generated when the first discharging circuit Q11 is on, the first discharging current of 20 microamperes ($\mu A$) is generated when the first discharging circuit Q12 is on, and the first discharging current of 10 microamperes ($\mu A$) is generated when the first discharging circuit Q13 is on.

Each first discharging loop includes a first discharging switch and a connected first discharging element. The first discharging switch is used to switch the first discharging loop on or off, and the first discharging element is used to generate the first discharging current when the first discharging loop is on.

Taking the signal compensation circuit 230 shown in FIG. 4 as an example, in the present embodiment, the first discharging loop Q11 includes a first discharging element M21 and a connected first discharging switch N21, the first discharging loop Q12 includes a first discharging element M22 and a connected first discharging switch N22. The first discharging loop Q13 includes a first discharging element M23 and a first discharging switch N23 electrically connected. Structures and working principles of the first discharging loops Q11, Q12, and Q13 are basically similar to those of the first charging loop P11.

The second compensation circuit 232 includes a plurality of second charging loops in parallel and a plurality of second discharging loops in parallel. The second charging loops and the second discharging loops are electrically connected to the charging-discharging node VRX. The second charging loops and the second discharging loops are independently controlled to be on or off. The second charging loops may be on during the charging period to generate the second charging currents, and the values of the second charging currents generated by the second charging loops may be different. The second discharging loops may be on during the discharging period to generate the second discharging currents, and the values of the second discharging currents generated by the second discharging loops may be different.

Taking the signal compensation circuit 230 shown in FIG. 4 as an example, the second compensation circuit 232 includes three second charging loops (second charging loops P21, P22, and P23) in parallel and three second discharging loops (second discharging loops Q21, Q22, and Q23) in parallel.

The second charging current of 4 microamperes ($\mu A$) is generated when the second charging circuit P21 is on, the second charging current of 2 microamperes ($\mu A$) is generated when the second charging circuit P22 is on, and the second charging current of 1 microampere ($\mu A$) is generated when the second charging circuit P23 is on.

The second discharging current of 4 microamperes ($\mu A$) is generated when the second discharging circuit Q21 is on, the second discharging current of 2 microamperes ($\mu A$) is generated when the second discharging circuit Q22 is on, and the second discharging current of 1 microampere ($\mu A$) is generated when the second discharging circuit Q23 is on.

Each second charging loop includes a second charging switch and a connected second charging element. The second charging switch is used to switch the second charging loop on or off, and the second charging element is used to generate the second charging current when the second charging loop is on. Each second discharging loop includes a second discharging switch and a connected second discharging element. The second discharging switch is used to switch the second discharging loop on or off, and the second discharging element is used to generate the second discharging current when the second discharging loop is on.

Taking the signal compensation circuit 230 shown in FIG. 4 as an example, in the present embodiment, the second charging loop P21 includes a second charging element M31 and a second charging switch N31. The second charging loop P22 includes a second charging element M32 and a second charging switch N32, the second charging loop P23 includes a second charging element M33 and a second charging switch N33, the second discharging loop Q21 includes a second discharging element M41 and a second discharging switch n41, the second discharging loop Q22 includes a second discharging element M42 and a second discharging switch N42, and the second discharging loop Q23 includes a second discharging element M43 and a second discharging switch N43. Structures and working principles of the second charging loops P21, P22 and P23 and the second discharging loops Q21, Q22 and Q23 are basically similar to those of the first charging loop P11.

The first compensation circuit 231 further includes a first current source 233 electrically connected to the first charging loops and the first discharging loops for providing power. The second compensation circuit 232 further includes a second current source 234 electrically connected to the second charging loops and the second discharging loops for providing another power.

During each charging period, at least one charging loop (including the first charging loops and the second charging loops) is on to generate the charging current (including the first charging current and the second charging current). That is, not all charging loops are on during each charging period. In different charging periods, the number of active charging loops may be different.

During each discharging period, at least one discharging loop (including the first discharging loops and the second discharging loops) is on to generate the discharging current (including the first discharging current and the second discharging current). That is, not all discharging loops are on during each discharging period. In different discharging periods, a number of active discharging loops may be different.

The signal compensation circuit 230 works during the charging period and the discharging period in a time-division manner, that is, the charging period and the discharging period do not overlap with each other. In the present embodiment, the signal compensation circuit 230 works during the charging period and the discharging period alternately.

In the present embodiment, the total charging current and the total discharging current are set by controlling the numbers of active charging circuits and active discharging circuits. When the sensing signals are received, the signal compensation circuit 230 is configured to determine the number of charging loops which are on and the number of discharging loops which are on according to the compensation value, so as to charge and discharge the charging-discharging node VRX in a time-division manner. The target signals based on the compensation values are outputted from the charging-discharging node VRX to the signal processing circuit 240.

As described above, the first compensation circuit 231 is configured to adjust the initial signals in large amplitudes, while the second compensation circuit 232 is configured to adjust the initial signals in smaller amplitudes. The signal compensation circuit 230 of the present embodiment realizes "coarse adjustment" through the first compensation circuit 231 and "fine adjustment" through the second compensation circuit 232. A cooperation of the first compensation circuit 231 and the second compensation circuit 232 avoids multiplication of circuit units to improve resolution, reducing a size of the signal compensation circuit 230.

Figure 5:
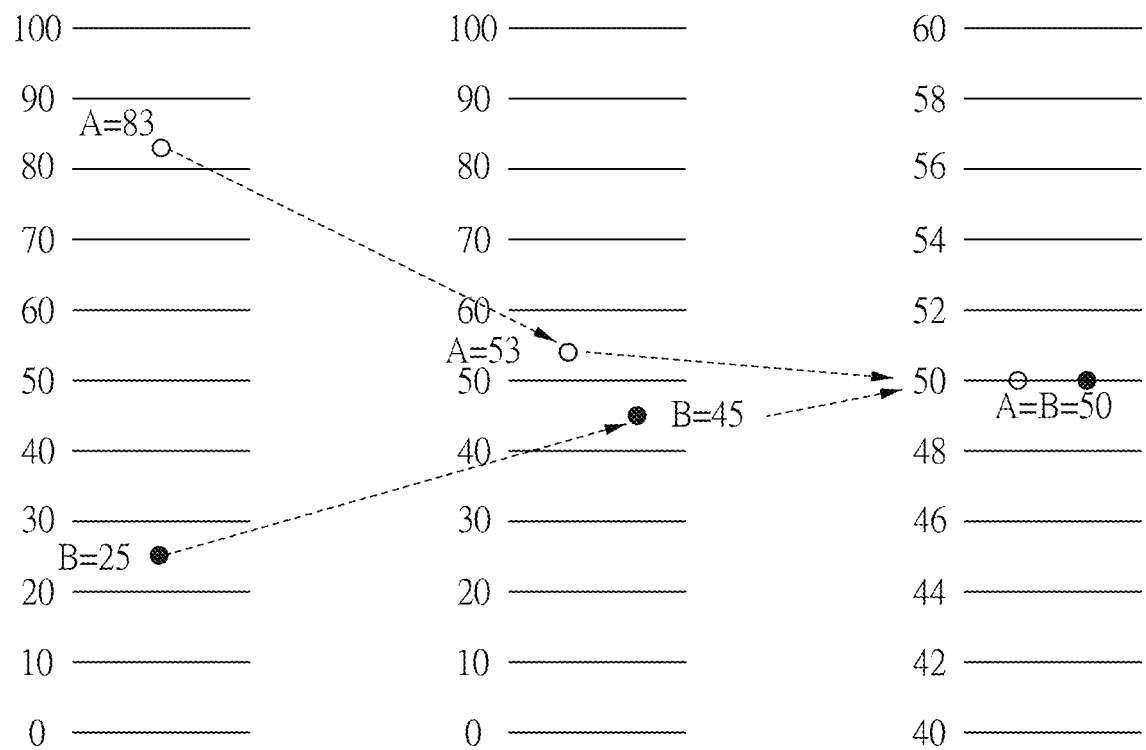
FIG. 5 is a schematic diagram of a compensating process of the signal compensation circuit.

Referring to FIG. 5, a process for the signal compensation circuit 230 to apply compensation is described below.

For example, a value "A" of an initial signal is 83 (a unit of the initial signal is not specified, which is because the initial signal may be a value convenient for calculation and is calculated according to a capacitance signal), and a value "B" of another initial signal is 25. The signal compensation circuit 230 is configured to apply compensation to the signal value "A" and "B" to the target value of 50, so that the values A and B are equal (or tending to be equal). The compensation value is 50−83=−33 for the value "A", and the compensation value is 50−25=25 for the value "B".

After the above compensation values are determined, the first charging loops, the second charging loops, the first discharging loops, and the second discharging loops are switched on or off according to the compensation values. Therefore, the first charging currents, the second charging currents, the first discharging currents, and the second discharging currents are added to be equal to the compensation values.

The total charging current generated by the first compensation circuit 231 is 20 uA+10 uA=30 uA when the first charging loops P12 and P13 are switched on, the total charging current generated by the second compensation circuit 232 is 2 uA+1 uA=3 uA when the second charging loops P22 and P23 are switched on, and the total charging current generated by the signal compensation circuit 230 is 30 uA+3 uA=33 uA. It is assumed that a current of 1 uA will reduce the signal value "A" by one unit, therefore, the value "A" can be adjusted from 83 to 50 (83−33=50).

The total discharging current generated by the first compensation circuit 231 is 20 uA when the first discharging loop Q12 is switched on, the total discharging current generated by the second compensation circuit is 4 uA+1 uA=5 uA when the second discharging loops Q21 and Q23 are switched on, and the total discharging current generated by the signal compensation circuit 230 is 20 uA+5 uA=25 uA. It is assumed that the discharging current of 1 uA will increase the value "B" by one unit, therefore, the value "B" can be adjusted from 25 to 50 (25+25=50).

In this way, the first compensation circuit 231 and the second compensation circuit 232 cooperate to apply compensation to the initial signals A and B to the target value of 50 or very closely to other target values.

Figure 6:
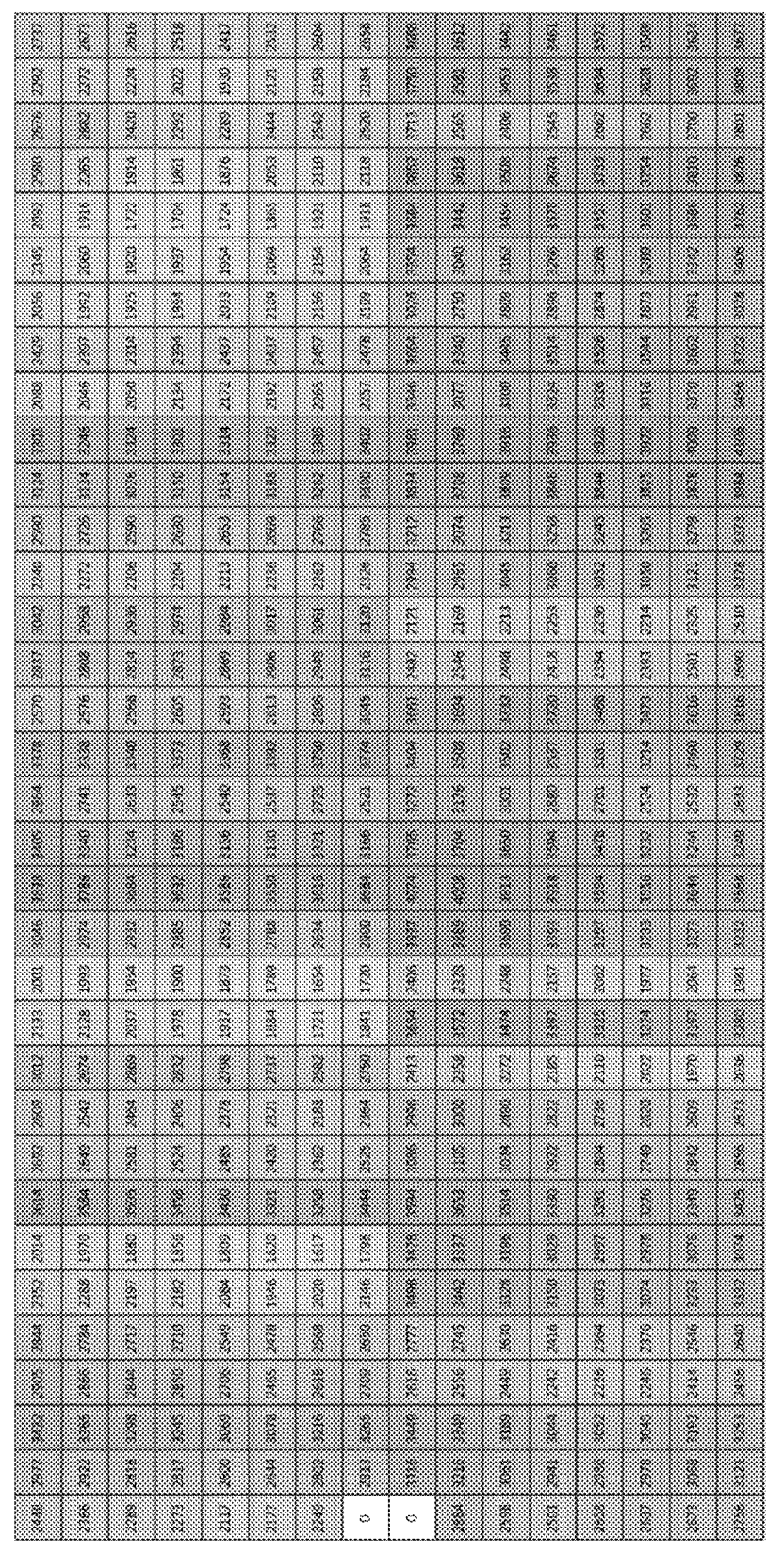
Figure 7:
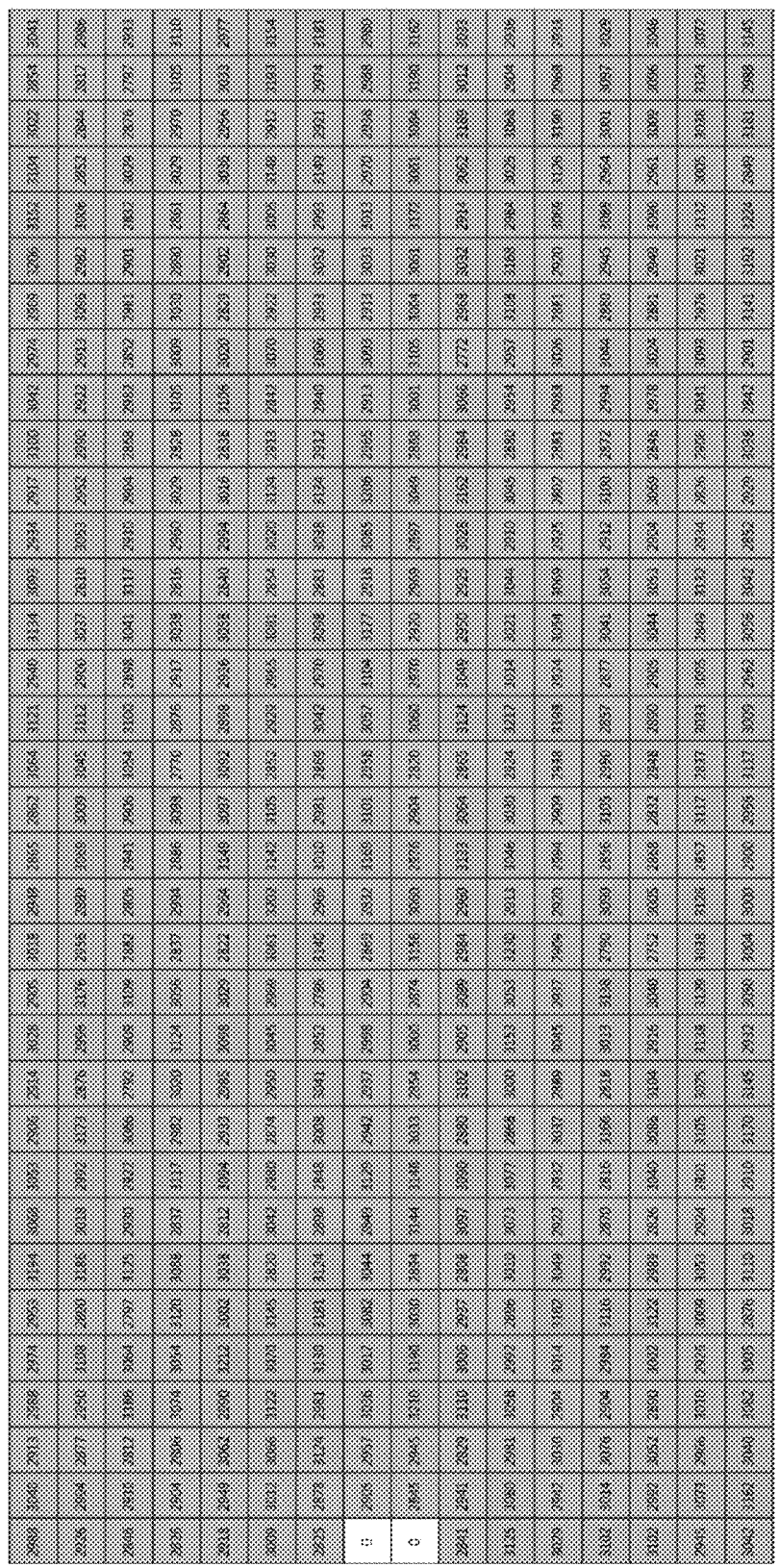
FIG. 7 is a schematic diagram illustrating compensation of signals on the plurality of touch electrodes.

FIG. 6 shows a distribution of the values of the initial signals on the touch electrodes 210 in an embodiment, and FIG. 7 shows a distribution of the values of signals after compensated based on the compensation values (each square in FIG. 6 and FIG. 7 represents one touch electrode). It can be seen from FIG. 6 and FIG. 7 that any differences of the values after compensation has been applied are significantly reduced. That is, a uniformity of values of the initial signals on the touch electrodes 210 is improved. The signal compensation circuit 230 of the present embodiment generates different compensation values for the initial signals on different touch electrodes 210, and the compensation values compensate for differences of the initial signals on different touch electrodes 210, improving a consistency of the initial signals. Therefore, when an object touches the display device 100, the sensing signals are uniformly affected by the initial signals (as if all the initial signals are effectively lost) which improves the accuracy of calculation as to the touch position.

In another embodiment of the present application, the signal compensation circuit 230 may be used to compensate for initial signals on other types of sensors other than the touch electrodes 210, wherein the other types of sensors are capacitive sensors (a capacitive sensor usually refers to a sensor that can detect capacitance changes when an object is in an electric field of the sensor). For example, the other types of sensors may be diamond-shaped touch electrodes or may include two layers of strip electrodes which intersect. A principle of the signal compensation circuit 230 is as described above when applied to the other types of sensors, and all beneficial effects of the signal compensation circuit 230 described above can also be achieved in relation to the other types.

It is to be understood, even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A signal compensation circuit, comprising:
   a first compensation circuit electrically connected to a plurality of sensors and a charging-discharging node, the first compensation circuit being configured to receive a plurality of initial signals from the plurality of sensors, generate a plurality of first charging currents to charge the charging-discharging node in a charging period, and generate a plurality of first discharging currents to discharge the charging-discharging node in a discharging period, the charging period and the discharging period do not overlap with each other; and
   a second compensation circuit electrically connected to the charging-discharging node, the second compensation circuit being configured to generate a plurality of second charging currents to charge the charging-discharging node in the charging period and generate a plurality of second discharging currents to discharge the charging-discharging node in the discharging period;

wherein values of the plurality of first charging currents are greater than values of the plurality of second charging currents, values of the plurality of first discharging currents are greater than value of the plurality of second discharging currents, the values of the plurality of first charging currents, the plurality of second charging currents, the plurality of first discharging currents, and the plurality of second discharging currents are configured to determine a plurality of compensation values, and the charging-discharging node is configured to output a plurality of target signals, the plurality of target signals are obtained by compensating the plurality of initial signals with the plurality of compensation values.

2. The signal compensation circuit of claim 1, wherein, the first compensation circuit comprises a plurality of first charging loops connected in parallel and a plurality of first discharging loops connected in parallel, the plurality of first charging loops and the plurality of first discharging loops are electrically connected to the charging-discharging node;

the second compensation circuit comprises a plurality of second charging loops connected in parallel and a plurality of second discharging loops connected in parallel, the plurality of second charging loops and the plurality of second discharging loops are electrically connected to the charging-discharging node;

in the charging period, at least one of the plurality of first charging loops and/or at least one of the plurality of second charging loops is on to generate at least one of the plurality of first charging currents and/or at least one of the plurality of second charging currents;

in the discharging period, at least one of the plurality of first discharging loops and/or at least one of the plurality of second discharging loops is on to generate at least one of the plurality of first discharging currents and/or at least one of the plurality of second discharging currents; and the plurality of first charging loops, the plurality of first discharging loops, the plurality of second charging loops, and the plurality of second discharging loops are controlled to be on or off to adjust a total charging current and a total discharging current, and the compensation values are defined as a difference between the total charging current and the total discharging current.

3. The signal compensation circuit of claim 2, wherein the first charging current generated by at least one of the plurality of first charging loops is different from the first charging current generated by each of other first charging loops;

the second charging current generated by at least one of the plurality of second charging loops is different from the second charging current generated by each of other second charging loops;

the first discharging current generated by at least one of the plurality of first discharging loops is different from the first discharging current generated by each of other first discharging loops; and the second discharging current generated by at least one of the plurality of second discharging loops is different from the second discharging current generated by each of other second discharging loops.

4. The signal compensation circuit of claim 2, wherein each of the plurality of first charging loops comprises a first charging switch and a first charging element electrically connected to the first charging switch;

the first charging switch is controlled to be on or off to control each of the plurality of first charging loops to be on or off; and each of the plurality of first charging loops is on and the plurality of first charging currents are generated when the first charging switch is on.

5. The signal compensation circuit of claim 4, wherein each of the plurality of first discharging loops comprises a first discharging switch and a first discharging element electrically connected to the first discharging switch;

the first discharging switch is controlled to be on or off to control each of the plurality of first discharging loops to be on or off; and each of the plurality of first discharging loops is on and the plurality of first discharging currents are generated when the first discharging switch is on.

6. The signal compensation circuit of claim 2, wherein each of the plurality of second charging loops comprises a second charging switch and a second charging element electrically connected to the second charging switch;

the second charging switch is controlled to be on or off to control each of the plurality of second charging loops to be on or off; and each of the plurality of second charging loops is on and the plurality of second charging currents are generated when the second charging switch is on.

7. The signal compensation circuit of claim 6, wherein each of the plurality of second discharging loops comprises a second discharging switch and a second discharging element electrically connected to the second discharging switch;

the second discharging switch is controlled to be on or off to control each of the plurality of second discharging loops to be on or off; and each of the plurality of second discharging loops is on and the plurality of second discharging currents are generated when the second discharging switch is on.

8. The signal compensation circuit of claim 1, wherein the plurality of sensors comprises a plurality of touch electrodes.

9. A touch control circuit, comprising:
a plurality of touch electrodes electrically insulated from each other;
a signal compensation circuit, comprising:
a first compensation circuit electrically connected to the plurality of touch electrodes and a charge-discharge node, the first compensation circuit being configured to receive a plurality of initial signals from the plurality of touch electrodes, generate a plurality of first charging currents to charge the charging-discharging node in a charging period, and generate a plurality of first discharging currents to discharge the charging-discharging node in a discharging period; and
a second compensation circuit electrically connected to the charging-discharging node, the second compensation circuit being configured to generate a plurality of second charging currents to charge the charging-discharging node in the charging period and generate a plurality of second discharging currents to discharge the charging-discharging node in the discharging period;

wherein values of the plurality of first charging currents are greater than values of the plurality of second charging currents, values of the plurality of first discharging currents are greater than value of the plurality of second discharging currents, the values of the plurality of first charging currents, the plurality of second charging currents, the plurality of first discharging currents, and the plurality of second discharging currents are configured to determine a plurality of compensation values, and the charging-discharging node is configured to output a plurality of target signals according to the plurality of initial signals compensated by the plurality of compensation values; and a signal processing circuit electrically connected to the signal compensation circuit and configured to calculate a touch position based on the plurality of target signals.

10. A display device, comprising:

a touch panel comprising a touch control circuit, the touch control circuit comprising:

a plurality of touch electrodes electrically insulated from each other;

a signal compensation circuit, comprising:

a first compensation circuit electrically connected to the plurality of touch electrodes and a charge-discharge node, the first compensation circuit being configured to receive a plurality of initial signals from the plurality of touch electrodes, generate a plurality of first charging currents in a charging period to charge the charging-discharging node, and generate a plurality of first discharging currents in a discharging period to discharge the charging-discharging node; and a second compensation circuit electrically connected to the charging-discharging node, the second compensation circuit being configured to generate a plurality of second charging currents in the charging period to charge the charging-discharging node and generate a plurality of second discharging currents in the discharging period to discharge the charging-discharging node;

wherein values of the plurality of first charging currents are greater than values of the plurality of second charging currents, values of the plurality of first discharging currents are greater than value of the plurality of second discharging currents, the values of the plurality of first charging currents, the plurality of second charging currents, the plurality of first discharging currents, and the plurality of second discharging currents are configured to determine a plurality of compensation values, and the charging-discharging node is configured to output a plurality of target signals according to the plurality of initial signals compensated by the plurality of compensation values; and a signal processing circuit electrically connected to the signal compensation circuit and configured to calculate a touch position based on the plurality of target signals; and a display panel configured to display images, the display panel comprising a plurality of scanning lines and a plurality of data lines, a plurality of parasitic capacitances being formed between the plurality of scan lines, the plurality of data lines and the plurality of touch electrodes to form the plurality of initial signals.

* * * * *